US010588239B2

(12) United States Patent
Chu (10) Patent No.: US 10,588,239 B2
(45) Date of Patent: Mar. 10, 2020

(54) CABINET SYSTEM OF DATA CENTER

(71) Applicant: FSP TECHNOLOGY INC., Taoyuan (TW)

(72) Inventor: Ting-Chuan Chu, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 177 days.

(21) Appl. No.: 15/979,824

(22) Filed: May 15, 2018

(65) Prior Publication Data
US 2018/0338384 A1    Nov. 22, 2018

(30) Foreign Application Priority Data
May 18, 2017   (TW) .............................. 106116533 A (51) Int. Cl.
*H05K 7/14*    (2006.01)
(52) U.S. Cl.
CPC ......... *H05K 7/1492* (2013.01); *H05K 7/1487* (2013.01)
(58) Field of Classification Search
CPC ........... H05K 2201/044; H05K 7/1487; H05K 7/1492; G06F 1/26
See application file for complete search history.

(56) References Cited

U.S. PATENT DOCUMENTS

| 2009/0152216 A1* | 6/2009 | Champion | .............. G06F 1/183 211/26 |
| 2012/0194350 A1* | 8/2012 | Crisp | ........................ G06F 1/26 340/815.42 |

FOREIGN PATENT DOCUMENTS

CN    207067930 U  *  3/2018

OTHER PUBLICATIONS

CN207067930U—Drawings (Year: 2019).*

* cited by examiner

*Primary Examiner* — Jinhee J Lee
*Assistant Examiner* — Ingrid D Wright
(74) *Attorney, Agent, or Firm* — WPAT, PC (57) ABSTRACT

The application discloses a cabinet system of a data center, including: a cabinet body, including a plurality of rack modules between a front side thereof and a rear side thereof; a plurality of data server hosts, detachably installed on the corresponding rack modules; and a power supply module, disposed on the corresponding rack module in the cabinet body, and coupled to at least one of the data server hosts. The power supply module includes a standardized frame compliant with a first specification. The standardized frame includes an accommodating groove for plug-in assembly of a power core unit having different parameters (e.g., output powers or dimension specifications). Thus, the power core unit having different parameters can be assembled through the standardized frame, providing the cabinet system with flexible configuration of power supplies as well as convenient maintenance or replacement.

14 Claims, 10 Drawing Sheets

CABINET SYSTEM OF DATA CENTER

BACKGROUND OF THE INVENTION

Field of the Invention

The invention relates to a cabinet system of a data center, and more particularly to a cabinet system with a variable power supply configuration.

Description of the Prior Art

A data center is a facility for disposing computer system hosts (or referred to as server hosts) and associated components. Power supplies used by computer system hosts in a data center may have different specifications in order to adapt to power requirements or special needs of the computer system hosts.

For example, industrial power supplies come in different dimension specifications (e.g., 1U, 2U, ATX and FLEX), and power supplies of these different dimensions are further divided into various categorizes according to number of watts (e.g., 100 W to 1200 W).

When a power supply in a data center is damaged and needs to be replaced, a maintainer of the data center is required to notify the manufacturer of the power supply for repair, which prolongs the time for restoring the normal operation of the data center and also increases associated maintenance costs of the data center.

On the other hand, if a maintainer of the data center performs maintenance instead, a cabinet body of the data center needs to be disassembled, and a computer system host needs to be pulled out to further open an upper lid of the host to remove the old power supply and replace the same with a new power supply. However, with such manner, warranty provided by the manufacturer becomes void after an outer cover of the upper lid of the host is opened up arbitrary by an individual. For the same reason, an excessively long period needed for repair with respect to the configuration of a power supply of a computer system host in a data center is frequently resulted. During this period, the loading of other computer system hosts is increased. Further, because the manufacturer needs to prepare diversified types of power supplies for various different computer system hosts, reserve inventory in large quantities and in numerous specifications is needed, thus failing to achieve optimized resource utilization. In other words, under the premise that large quantities and diversified types of power supplies need to be prepared, resource waste may be further resulted due to an excessively long inventory period.

SUMMARY OF THE INVENTION

It is an object of the present invention to provide a solution for easy maintenance or repair of a power supply module in a cabinet system.

It is another object of the present invention to enhance utilization efficiency and reduce resource waste for a power supply module needed by a cabinet system.

To achieve the above objects, the present invention provides a cabinet system of a data center. The cabinet system includes a cabinet body, a plurality of data server hosts and a power supply module. The cabinet body includes a front side and a rear side that are opposite, and a plurality of rack modules are provided between the front side and the rear side. The data server hosts are detachably installed on the corresponding rack modules. The power supply module is provided on the corresponding rack module in the cabinet body, and is coupled to at least one of the data server hosts. The power supply module includes a standardized frame, which is compliant with a first specification and has an accommodating groove. The accommodating groove is adapted for plug-in assembly of one single power core unit, and is capable of accommodating the power core unit having different parameters. The standardized frame enables the power core unit to be detachably-replaced at the rear side of the cabinet body.

In one embodiment of the present invention, a parameter of the power core unit includes a dimension specification of the power core unit, and a configuration relationship between the first specification of the standardized frame and the dimension specification of the power core unit may be one selected from a group consisting of: a combination of IPC-1U and IPC-Flex, a combination of IPC-2U and IPC-Flex, a combination of IPC-2U and IPC-1U, a combination of IPC-2U and IPC-SFX, and a combination of IPC-AT/ATX and IPC-SFX.

In one embodiment, the different parameters of the power core unit are different output powers or different dimension specifications.

In one embodiment, the power core unit is provided with a first electrical connection port. The power supply module includes a first power supply board disposed in the standardized frame, and a second electrical connection port is provided on the first power supply board for connecting to the first electrical connection port. The second electrical connection port are coupled to a digital control module. The digital control module modulates electrical power from the power core unit to drive the corresponding data server host. Further, the first electrical connection port is a golden finger connector, and the second electrical connection port is a docking connector. Each of the golden finger connectors and each of the docking connectors individually include a plurality of terminals, and an application combination of these terminals corresponds to the power core unit having different output powers. The standardized frame is for replacement of the power core unit having different dimension specifications.

In one embodiment of the present invention, the power core unit is provided with a first electrical connection port, and the power supply module includes docking assembly. The docking assembly includes a third electrical connection port, and a wire connection group coupled to the third electrical connection port and coupled to a plurality of power receiving terminals in the corresponding data server host. The third electrical connection port is docked with the first electrical connection port.

In one embodiment of the present invention, the parameter of the power core unit includes a dimension specification of the power core unit, and both of the dimension specification of the power core unit and the first specification of the standardized frame are compliant with existing dimension specifications of power supplies.

In one embodiment, the standardized frame includes an opening, and an outer surface of the power core unit has a safety regulation information region for labeling a safety specification. When the power core unit is assembled in the standardized frame, the opening corresponds to the safety regulation information region to show the safety specification.

To achieve the above and other objects, the present invention further discloses a cabinet system of a data center. The cabinet system includes a cabinet body, a plurality of data server hosts and a power supply module. The cabinet body includes a front side and a rear side that are opposite, and a plurality of rack modules are provided between the front side and the rear side. The data server hosts are detachably installed on the corresponding rack modules. The power supply module is provided on the corresponding rack module in the cabinet body, and is coupled to at least one of the data server hosts. The power supply module includes a standardized frame, which is compliant with a first specification and has an accommodating groove. The accommodating groove is adapted for plug-in assembly of a plurality of power core units having different parameters. The standardized frame enables the power core units to be detachably replaced at the rear side of the cabinet body, and is capable of simultaneously accommodating at least two power core units.

In one embodiment of the present invention, parameters of the power core units include dimension specifications of the power core units, the quantity of the power core units is two, and a configuration relationship between the dimension specifications of the two power core units is selected from a group consisting of: a combination of both IPC-Flex, a combination of both IPC-1U, a combination of one IPC-Flex and one IPC-1U.

In one embodiment, each of the power core units is provided with a first electrical connection port. The power supply module includes a first power supply board disposed in the standardized frame, and a plurality of second electrical connection ports is provided on the first power supply board for docking with the first electrical connection ports. The plurality of second electrical connection ports are coupled to a digital control module. The digital control module modulates electrical power from the power core units to drive the data server hosts. Further, each of the first electrical connection ports is a golden finger connector, and each of the second electrical connection ports is a docking connector. Each of the golden finger connectors and each of the docking connectors individually include a plurality of terminals, and an application combination of these terminals corresponds to the power core units having different predetermined specifications. The standardized frame is for replacement of the power core units having the different predetermined specifications.

In one embodiment, each of the power core units is provided with a first electrical connection port. The power supply module includes a conductive element, a first power supply board and a second power supply board. The conductive element is disposed in the standardized frame for uniting electrical power provided by the power core units. The first power supply board is disposed in the standardized frame. A plurality of second electrical connection ports docked with the first electrical connection ports are disposed on the first power supply board. The first power supply board is coupled to the conductive element, and the second electrical connection ports are individually coupled to the conductive element. The second power supply board is disposed in the standardized frame, and is coupled to the first power supply board via the conductive element, and carries a second digital control module coupled to the conductive element. The second digital control module modulates electrical power from the conductive element to drive the corresponding data server host.

In one embodiment of the present invention, each of the power core units is provided with a first electrical connection port, and the power supply module includes a plurality of docking assemblies. Each of the docking assemblies includes a third electrical connection port, and a plurality of wire connection groups coupled to the third electrical connection port and coupled to a plurality of power receiving terminals in the corresponding data server host.

In one embodiment of the present invention, a parameter of each of the power core units includes a dimension specification of the power core unit, and all of the dimension specifications of the power core units and the first specification of the standardized frame compliant with regulations of existing dimension specifications of power supplies.

In one embodiment of the present invention, the standardized frame includes a plurality of openings, and an outer surface of each of the power core units has a safety regulation information region for labeling a safety specification. When the power core units are assembled in the standardized frame, the openings correspond to the safety regulation information regions to show the safety specification.

In one embodiment, the standardized frame has an opening, and an outer surface of each of the power core units has a safety regulation information region for labeling a safety specification. When the power core units are assembled in the standardized frame, a range of the opening covers the safety regulation information regions on the outer surfaces of the power core units to show the safety specification on the outer surfaces of the power core units assembled in the accommodating groove of the standardized frame. The standardized frame may also include a plurality of openings. When the power core units are assembled in the standardized frame, the openings correspond to the safety regulation information regions on the outer surfaces of the power core units to show the safety specification.

With the above configuration of the power supply module, the standardized frame is adapted for assembly of power core units having different parameters, further providing the cabinet system with flexible configuration of power supplies, facilitating maintenance and repair processes, and achieving more efficient utilization of power core units needed by the cabinet system to reduce resource waste.

DETAILED DESCRIPTION OF THE EMBODIMENTS

To better understand the objects, features and effects of the present invention, embodiments are described in detail with the accompanying drawings below.

Figure 1:
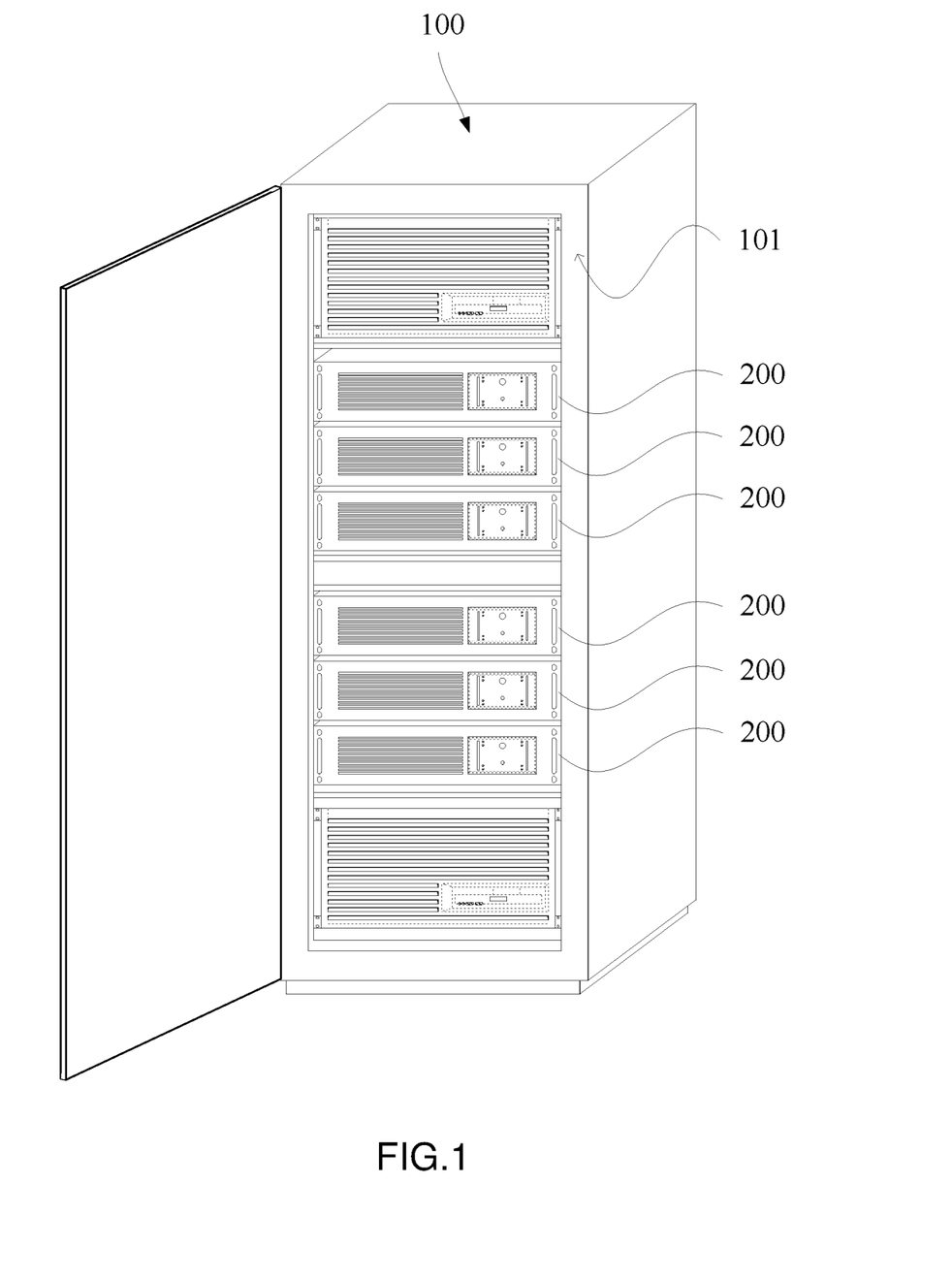
FIG. 1 shows a front view of a cabinet system of a data center according to an embodiment.
Figure 2:
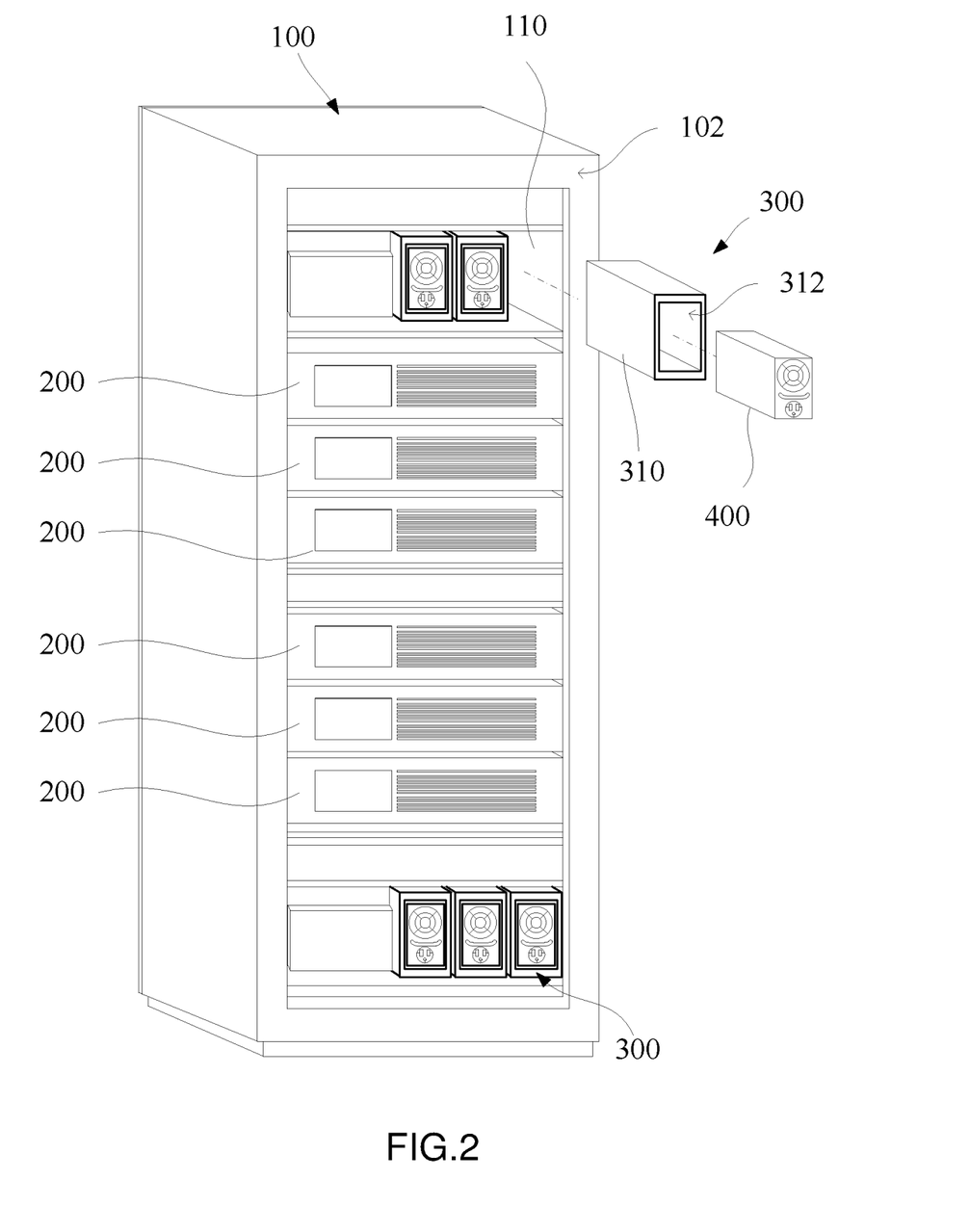
FIG. 2 shows a rear view of a cabinet system of a data center according to an embodiment.

Referring to FIG. 1 and FIG. 2, FIG. 1 shows a front view of a cabinet system of a data center according to an embodiment, and FIG. 2 shows a rear view of a cabinet system of a data center according to an embodiment. The data center is a cabinet system in form of a cluster constructed by multiple cabinet bodies 100 shown in FIG. 1 or FIG. 2, for example. Each of the cabinet bodies 100 is installed with a plurality of data server hosts 200, and is, for the same reason, usually installed with a plurality of power supply modules 300 to correspondingly provide power needed by the data server hosts 200. The power supply modules 300 may be assembled with the corresponding data server hosts 200, be centralized above or below the data server hosts 200 as shown in the examples in FIG. 1 or FIG. 2, or be in another configuration.

A plurality of rack modules 110 are provided between a front side 101 and a rear side 102 of each cabinet body 100 for the corresponding data server host 200 to be installed therein (e.g., by means of fastening or engaging). Each data server host 200, for example, is detachably installed on the corresponding rack module 110. The power supply module 300 is also provided on the corresponding rack module 110 in the cabinet body 100, and is coupled to the corresponding data server host 200 to correspondingly provide power needed by the data server host 200.

Each of the power supply modules 300 includes a standardized frame 310. The standardized frame 310 includes an accommodating groove 312, which may accommodate, in different embodiments, one single power core unit 400 or a plurality of power core units 400, and is adapted for plug-in assembly of the power core unit 400. In FIG. 1 and FIG. 2, the accommodating groove 312 accommodating one single power core unit 400 is illustrated as an example. Further, the standardized frame 310 further allows a user to directly perform pluggable replacement of the power core unit 400 at the rear side of the cabinet body 100. The actual distinguishing and definition of the front side and the rear side of the cabinet body 100 may be determined according to actual construction requirements of the data enter.

The power core unit 400 in the accommodating groove 312 is assembled with the standardized frame 310, which may provide power to a load through a connecting wire group (not shown). A user may accordingly select the power core unit 400 of the required power parameter to fulfill the electrical power requirement of the corresponding data server host 200, and may flexibly allocate an appropriate power core unit 400 according to the requirement of the data server host 200. That is, the accommodating groove 312 is capable of accommodating the power core unit 40 having different parameters. For example, when the power requirement of the corresponding data server host 200 rises to a level that cannot be handled by the original power core unit 400, a user may directly replace, through the detachable assembly structure, the original power core unit 400 to another power core unit 400 having a larger output power, and vice versa, thus achieving effective utilization and saving of resources.

The standardized frame 310, for example, is detachably installed on the corresponding rack module 110. The dimension of the standardized frame 310 is compliant with a first specification. Further, the accommodating groove 312 of the standardized frame 310, as previously described, is for plug-in assembly of one single core unit 400 shown in FIG. 1 and FIG. 2; that is, the dimension regulated by the first specification is greater than the dimension of the one single power core unit 400. The first specification is an existing dimension specification (e.g., IPC-1U, IPC-2U and IPC-AT/ATX) of power supplies in one embodiment, and may be a non-existing dimension specification of power supplies in another embodiment. Whether the dimension of the standardized frame 310 is an existing dimension specification of power supplies or a non-existing dimension specification of power supplies, in this embodiment and in the another embodiment, the first specification is for accommodating the power core unit 400 compliant with the existing power supply dimension specification.

The parameter of the power core unit 400 includes the output power of the power core unit 400 and the dimension specification (e.g., IPC-Flex, IPC-SFX, IPC-1U, IPC-2U and IPC-AX/ATX) of the power core unit 400. Based on the convenience of the standardized frame 310 of the power supply module 300, the power core unit 400 carried may be conveniently replaced. For example, with respect to these existing dimension specifications (e.g., IPC-Flex, IPC-SFX, IPC-1U, IPC-2U, and IPC-AX/ATX), a configuration relationship between the first specification of the standardized frame 310 and the dimension specification of the power core unit 400 may be one selected from a group consisting of (with the former being the first specification of the standardized frame 310, and the latter being the specification of the power core unit 400): a combination of IPC-1U and IPC-Flex, a combination of IPC-2U and IPC-Flex, a combination of IPC-2U and IPC-1U, a combination of IPC-2U and IPC-SFX, and a combination of IPC-AT/ATX and IPC-SFX. Further, through a frame design of the standardized frame 310, the first specification of the standardized frame 310 may accommodate the dimension specifications of multiple types of power core units 400, e.g., the standardized frame 310 having the IPC-2U specification may accommodate the power core unit 400 having the IPC-Flex specification or the power core unit 400 having the IPC-1U specification. For future specification evolution and development, with respect to the combination of dimension specifications, given that the power core unit 400 having a certain dimension specification can be accommodated in the standardized frame 310 having another dimension specification, such combination is appropriate as an implementation of an embodiment of the present invention. Further, in the standardized frame 310, different rails, supports or other securing arrangements may be provided according to different power core units 400 to be accommodated, so as to secure the power core units 400 to be assembled in the standardized frame 310.

Figure 3A:
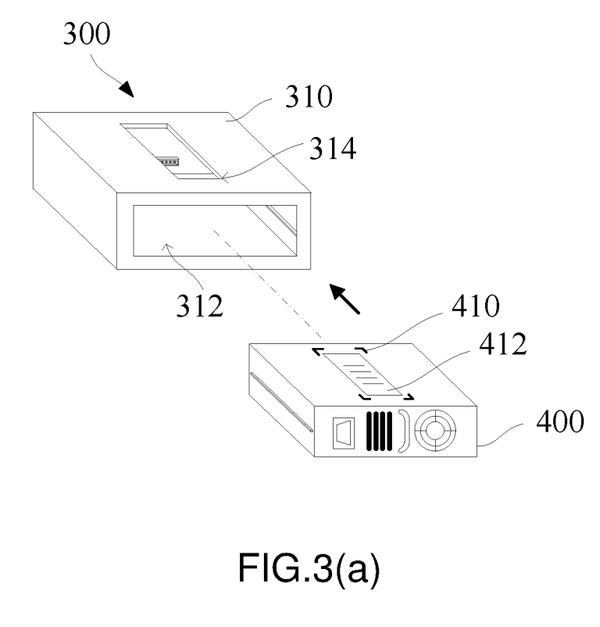
FIG. 3(a) shows a schematic diagram of the power core unit not yet accommodated in the standardized frame.
Figure 3B:
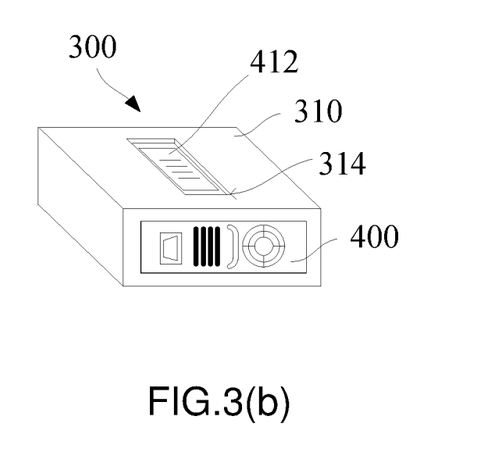
FIG. 3(b) shows a schematic diagram of the power core unit accommodated in the standardized frame.

Referring to FIG. 3(a) and FIG. 3(b), FIG. 3(a) shows a schematic diagram of the power core unit 400 not yet accommodated in the standardized frame 310, and FIG. 3(b) shows a schematic diagram of the power core unit 400 accommodated in the standardized frame 310. The standardized frame 310 includes an opening 314, and a safety regulation information region 410 is provided on an outer surface of the power core unit 400. The safety regulation information region 410 is for labeling a safety specification 412; for example, the safety specification 412 is labeled by a sticker specifying the safety specification 412 attached on the safety regulation information region 410. Thus, the overall of the power supply module 300 carrying the power core unit 400 may become a power supply compliant with safety regulations, and the power supply manufacturer only needs to conduct safety certification and manufacturing of reserved products with respect to the power core unit 400. The requirements of a user for power supply specifications are first satisfied by the design of the dimension specification of the standardized frame 310, and the power core unit 400 manufactured by the power supply manufacturer is assembled in the standardized frame 310. Thus, the power core unit 400 may be simplified as only a few types need to be manufactured. For both products sold directly and reserved inventory, such design of a detachable assembly structure achieves optimization of resource utilization, and so the power supply manufacturer is not required to prepare diversified types and large quantities of power supplies, and excessive costs caused by safety regulation inspection and certification processes for these diversified types and large quantities of power supplies are also eliminated. For a user, the power core unit 400 can be easily disassembled to perform maintenance or repair.

As shown in FIG. 3(b), the power core unit 400 is assembled in the accommodating groove 312 of the standardized frame 310, and with a position design, the safety regulation information region 410 on the outer surface of the power core unit 400 may correspond to the opening 314, further revealing the safety regulation information region 410 to the exterior and thus showing the safety specification 412.

Figure 4:
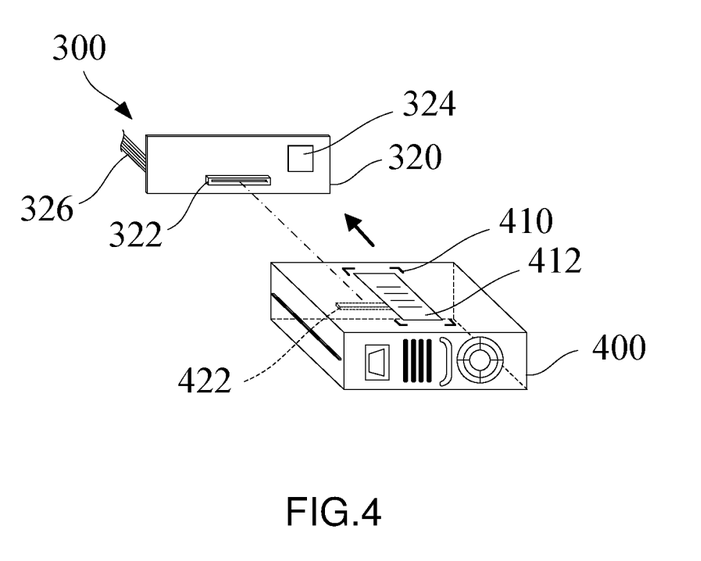
FIG. 4 shows a schematic diagram of a further circuit configuration of the power supply module according to an embodiment.

FIG. 4 shows a schematic diagram of a further circuit configuration of the power supply module 300 according to an embodiment. The power supply module 300 includes a first power supply board 320, which is fixed in the standardized frame 310 (not shown). The first power supply board 320 is provided with a second electrical connection port 322. When the power core unit 400 is assembled in the standardized frame 310 (not shown), the second electrical connection portion 322 may be coupled to a first electrical connection port 422 at one end of the power core unit 400. The first power supply board 320 is further provided with a digital control module 324. The digital control module 324 modulates electrical power from the power core unit 400, and transmits the electrical power through a transmission line group 326 to the corresponding data server host 200 to drive the data server host 200. The digital control module 324 may be implemented and achieved by a single digital control chip or a plurality of digital control chips.

In the circuit configuration in FIG. 4, the first electrical connection port 422 is a golden finger connector, and the second electrical connection port 322 is a docking connector for docking the golden finger connector. Each of the golden finger connector and the docking connector individually include a plurality of terminals, and an application combination of these terminals corresponds to the power core unit 400 having different output powers. That is, the power core unit 400 supplying different watts of power have terminals using different channels on the first electrical connection port 422 thereof. Accordingly, when the power core unit 400 is assembled in the standardized frame 310, the terminals of the second electrical connection port 322 on the first power supply board 320 can be coupled to a terminal combination of the corresponding channels of the first electrical connection port 422. Through the above coupling relationship, the digital control module 324 is enabled to quickly determine at low costs the number of watts of power provided by the power core unit 400 coupled thereto.

Figure 5:
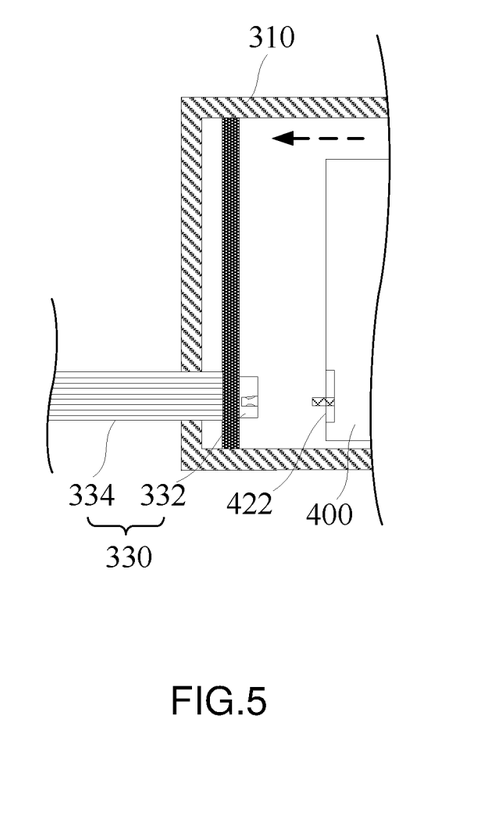
FIG. 5 shows a section view of a further circuit configuration of the power supply module according to another embodiment.

FIG. 5 shows a section view of a further circuit configuration of the power supply module 300 according to another embodiment. In the power supply module 300, a docking assembly 330 is used to directly couple the power core unit 400 to the corresponding data server host 200. The docking assembly 330 includes a third electrical connection port 332 and a wire connection group 334. The third electrical connection port 332 is docked with the first electrical connection port 422, and the wire connection group 334 is coupled to a plurality of power receiving terminals in the corresponding data server host 200.

Figure 6:
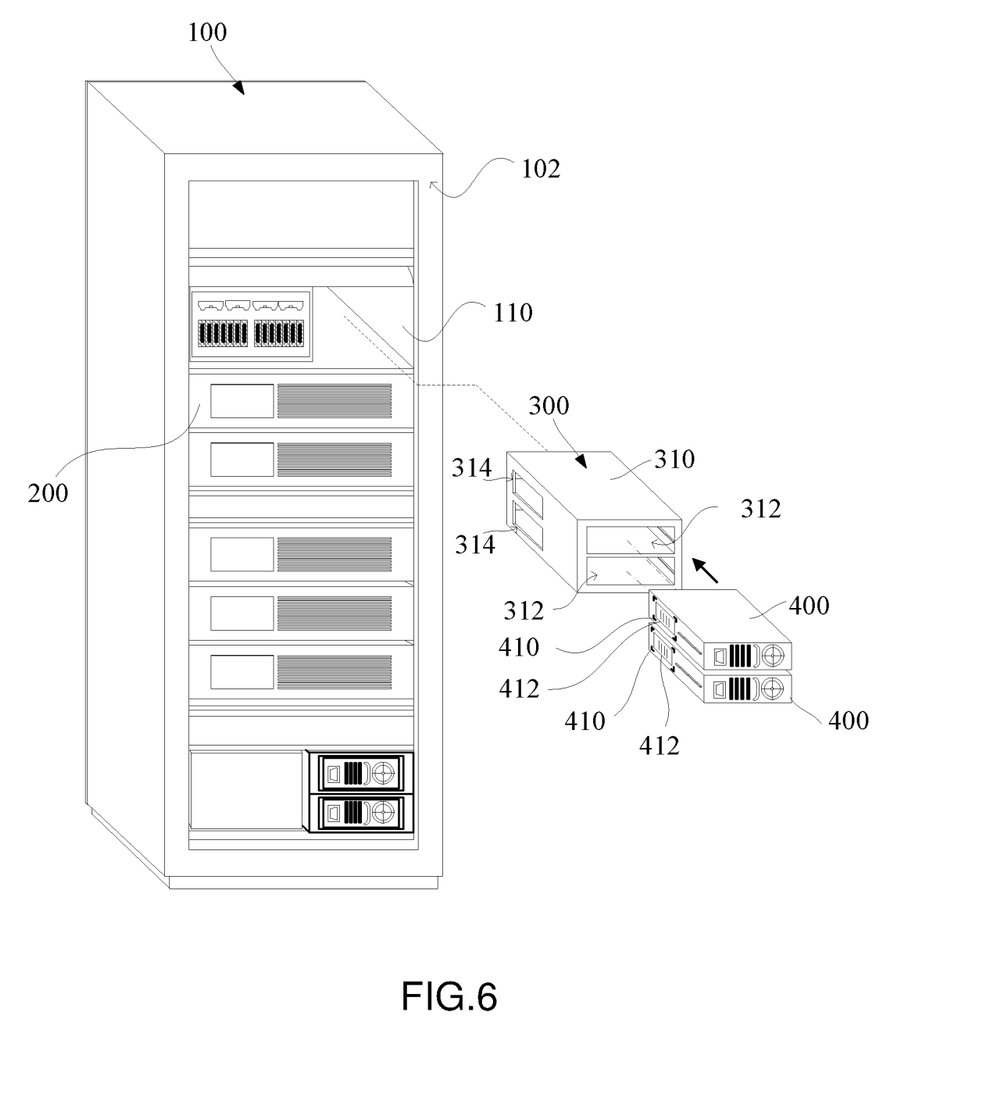
FIG. 6 shows a rear view of a cabinet system of a data center according to another embodiment.

FIG. 6 shows a rear view of a cabinet system of a data center according to another embodiment. In this embodiment, the accommodating groove 312 of the standardized frame 310 is adapted for accommodating plug-in assembly of a plurality of power core units 400; that is, the accommodating groove 312 is able to accommodate two or more power core units 400 at a time. In this embodiment, the standardized frame 310 has, for example, a dimension specification as the IPC-AT/ATX specification, and a value of length*width*height being 190 (mm)*150 (mm)*86 (mm). In the standardized frame 310, two power core units 400 having a dimension specification as the IPC-Flex are accommodated, with a value of length*width*height of the IPC-Flex being 150 (mm)*81.5 (mm)*40.5 (mm). Two stacked power core units 400 having the IPC-Flex specification are installed in the standardized frame 310. Further, all of the dimension specification of the power core units 400 and the first specification of the standardized frame 310 are compliant with the current regulations on dimension specifications of power supplies.

For future specification evolvement and development, with respect to the combination of dimension specifications, given that multiple power core units 400 having a certain dimension specification can be accommodated in the standardized frame 310 having another dimension specification, such combination is appropriate as an implementation of an embodiment of the present invention. Further, multiple power core units 400 having different dimension specifications may also be used in conjunction. For example, assuming that there are two power core units 400, a configuration relationship between the dimension specifications of these two power core units may be one selected from a group consisting of: a combination of both IPC-Flex, a combination of both IPC-1U, a combination of one IPC-Flex and one IPC-1U. Further, in the standardized frame 310, different rails or securing arrangements may be provided according to a plurality of different or a plurality of identical power core units 400 to be accommodated, so as to secure the power core units 400 to be assembled in the standardized frame 310.

As shown in FIG. 6, the standardized frame 310 may include a plurality of openings 314, and a safety regulation information region 410 for labeling a safety specification 412 is provided on an outer surface of each of the power core units 400. When the power core units 400 are installed in the standardized frame 310, the openings 314 correspond to the safety regulation information regions 410 on the outer surfaces of the power core units 400 to show the safety specification 412.

Figure 7:
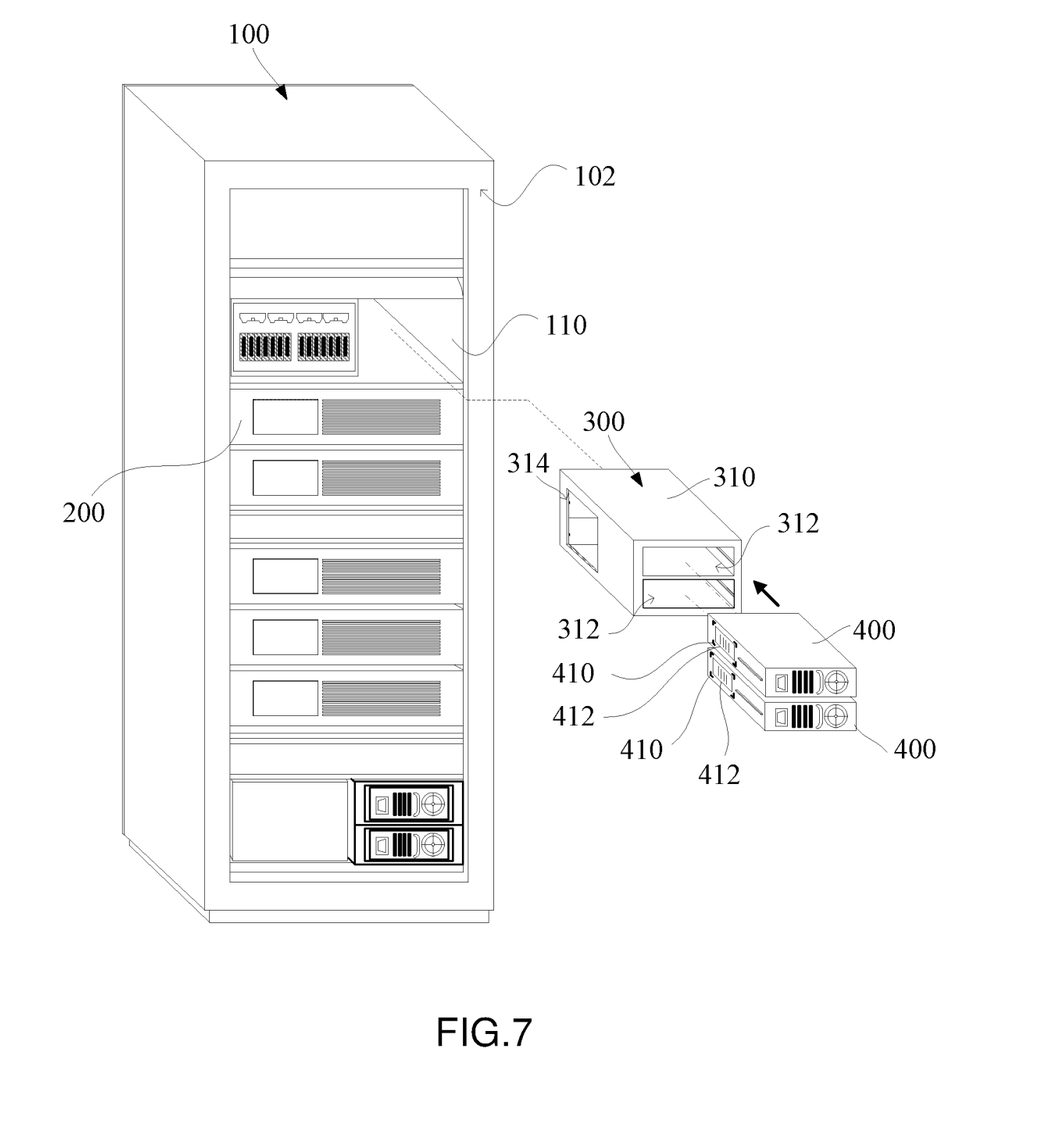
FIG. 7 shows a rear view of a cabinet system of a data center according to yet another embodiment.

FIG. 7 shows a rear view of a cabinet system of a data center according to still another embodiment. In this embodiment, the standardized frame 310 includes only one single opening 314. When the power core units 400 are installed in the standardized frame 310, the opening 314 in a larger size may correspond to the safety regulation information regions 410 on the outer surfaces of the power core units 400 to show the safety specification 412.

Figure 8:
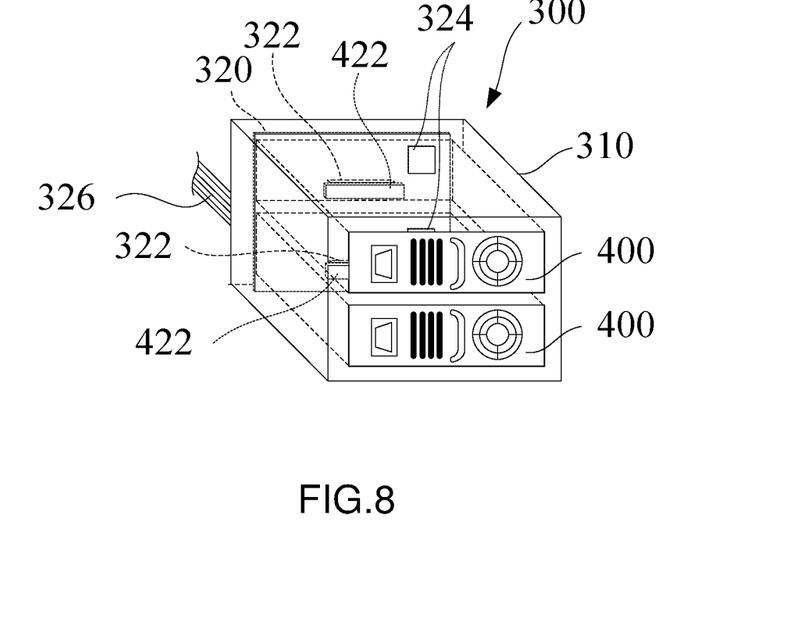
FIG. 8 shows a schematic diagram of the standardized frame accommodating a plurality of power core units therein.

FIG. 8 shows a schematic diagram of the standardized frame 310 accommodating a plurality of power core units 400 therein. The power supply module 300 includes a first power supply board 320, which is fixed in the standardized frame 310. The first power supply board 320 is provided with a plurality of second electrical connection ports 322. When the corresponding power core unit 400 is installed in the standardized frame 310, these second electrical connection ports 322 are coupled to a first electrical connection port 422 at one end of the corresponding power core unit 400. The first power supply board 320 is provided with a digital control module 324 (as depicted in FIG. 8 showing an example of a digital control module 324 consisted of two digital control chips). The digital control module 324 modulates electrical power from the power core units 400, and transmits the electrical power through the transmission line group 326 to the corresponding data server host 200 to drive the data server hosts 200.

For example, the digital control module 324 may combine the electrical power provided by the power core units 400 and provide the combined electrical power to the corresponding data server host 200. For example, electrical power of two power core units 400 each providing 180 watts is combined into 360 watts, and the combined electrical power of 360 watts is provided to the corresponding data server host 200. On the other hand, for example, the digital control module 324 may use the electrical power provided by one of the core units 400 as backup power. For example, between two power core units 400 each providing 180 watts, when one of them that provides 180 watt malfunctions, the digital control module 324 controls the other power core unit 400 providing 180 watts as a replacement to maintain the continuous electrical power provided to the corresponding data server host 200.

Further, as previously described, each of the first electrical connection ports 422 is a golden finger connector, and each of the second connection port 322 is a docking connector. Each of the golden finger connector and each of the docking connectors individually include a plurality of terminals, an application combination of these terminals correspond to power core units 400 having different predetermined specifications, and the standardized frame 310 is adapted for replacement of the power core units 400 having the different predetermined specifications.

Figure 9:
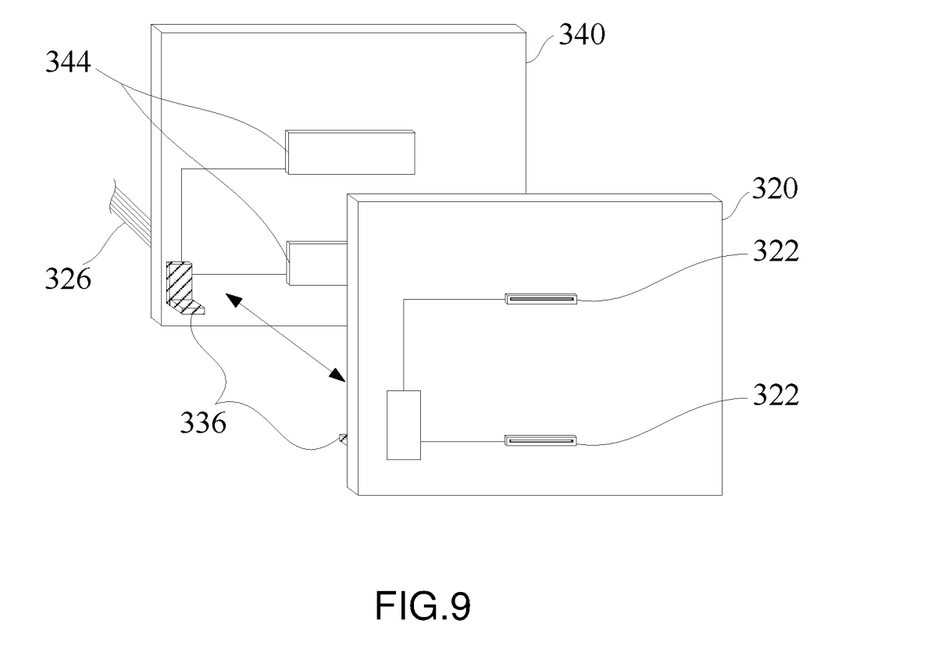
FIG. 9 shows a schematic diagram of a circuit board of a plurality of power core units accommodated in the standardized frame according to another embodiment.

FIG. 9 shows a schematic diagram of a circuit board of a plurality of power core units 400 accommodated in the standardized frame 310 according to another embodiment. The power supply module 300 includes a conductive element 336, a first power supply board 320 and a second power supply board 340. The first power supply board 320 is provided thereon with a conductive element 336 uniting the electrical power provided by these power core units 400 as synergy, and each of the second electrical connection ports 322 is coupled to the conductive element 336. The second power supply board 340 is disposed in the standardized frame 310, and is coupled to the first power supply board 320 through the conductive element 336. The second power supply board 340 carries a second digital control module 344 coupled to the conductive element 336. The second digital control module 344 modulates the electrical power from the conductive elements 336 to drive the corresponding data server host 200.

The conductive element 336 may be formed by two metal conductors connected to each other. Further, with the configuration of the two plate bodies including the first power supply board 320 and the second power supply board 340, the distribution of circuit elements may be dispersed, further providing better insulation strength in a situation of higher power and high current allocated by a larger number of power core units 400. Further, because circuit elements are distributed on two plate bodies, better heat dissipation may be additionally provided.

Figure 10:
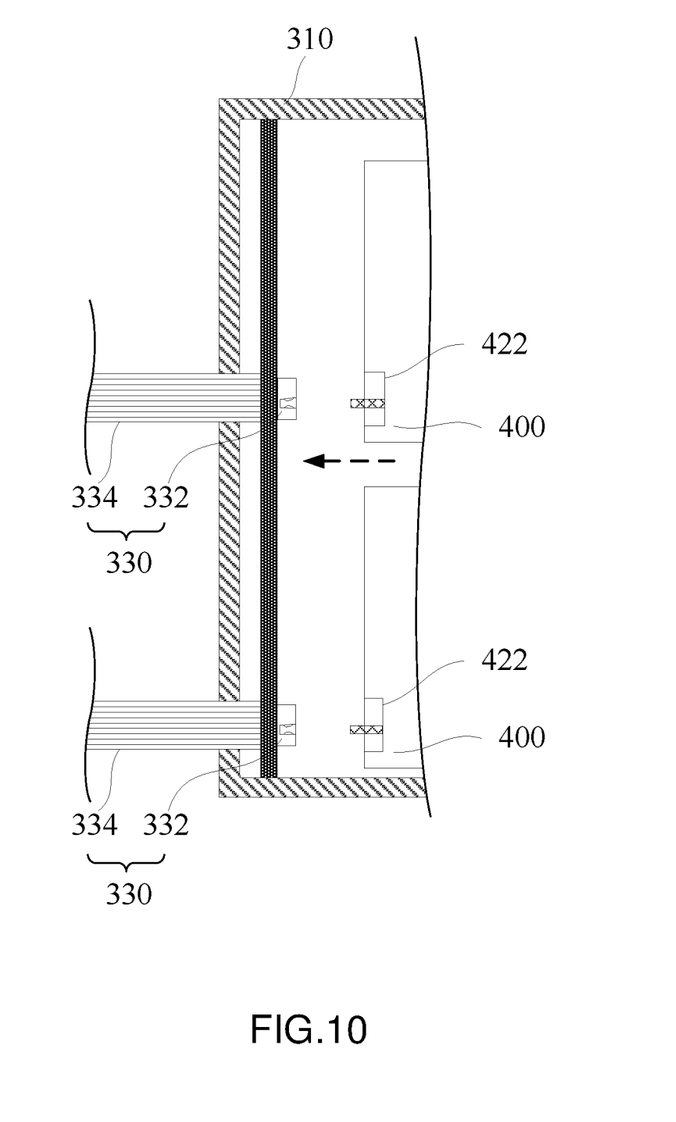
FIG. 10 shows a section view of a further circuit configuration of the power supply module with a plurality of power core units accommodated in the standardized frame thereof.

FIG. 10 shows a section view of a further circuit configuration of the power supply module 300 with a plurality of power core units 400 accommodated in the standardized frame 310 thereof. In the power supply module 300, a plurality of docking assemblies 330 are used to directly couple the power core units 400 with the corresponding data server host 200. Each of the docking assemblies 330 includes a third electrical connection port 332 and a wire connection group 334. The third electrical connection port 332 is docked with the first electrical connection port 422, and the wire connection group 334 is coupled to a plurality of power receiving terminals in the corresponding data server host 200.

In conclusion, the configuration relationships of the standardized frame and the power core unit disclosed in the embodiments enable a cabinet system to achieve various implementations with flexible configurations as well as easy maintenance and replacement of power supplies, providing effective utilization of power core units needed by the cabinet system, reducing resource waste, and further alleviating inventory pressure caused by power core units for power supply manufacturers.

While the invention has been described by way of example and in terms of the preferred embodiments, one skilled in the art can understand that the embodiments are for explaining the present invention, and are not to be construed as limitations to the present invention. It is to be not that, equivalent modifications and arrangements made based on the embodiments are covered within and the scope of the present invention. Therefore, the scope of the present invention should be accorded by the broadest interpretation of the appended claims of the application.

What is claimed is:
1. A cabinet system of a data center, comprising:
a cabinet body, comprising a front side and a rear side that are opposite, and a plurality of rack modules between the front side and the rear side;
a plurality of data server hosts, detachably installed on the corresponding rack modules; and
a power supply module, disposed on the corresponding rack module in the cabinet body and coupled to at least one of data server hosts, the power supply module comprising:
a standardized frame, compliant with a first specification, the standardized frame comprising an accommodating groove, the accommodating groove used for a plug-in assembly of one single power core unit and capable of accommodating the power core unit having different parameters;
wherein the standardized frame enables the power core unit to be detachably replaced at the rear side of the cabinet body, and the different parameters of the power core unit are different output powers or different dimension specifications; and
wherein the power core unit is provided with a first electrical connection port, and the power supply module comprises:
a first power supply board disposed in the standardized frame, and a second electrical connection port provided on the first power supply board for connecting to the first electrical connection port, the second electrical connection port coupled to a digital control module, the digital control module modulating elec- trical power from the power core unit to drive the corresponding data server host.

2. The cabinet system according to claim 1, wherein a parameter of the power core unit comprises a dimension specification of the power core unit, and a configuration relationship of the first specification of the standardized frame and the dimension specification of the power core unit is one selected from a group consisting of: a combination of IPC-1U and IPC-Flex, a combination of IPC-2U and IPC-Flex, a combination of IPC-2U and IPC-1U, a combination of IPC-2U and IPC-SFX, and a combination of IPC-AT/ATX and IPC-SFX.

3. The cabinet system according to claim 1, wherein the first electrical connection port is a golden finger connector, the second electrical connection port is a docking connector, each of the golden finger connector and the docking connector individually comprise a plurality of terminals, an application combination of the terminals corresponds to the power core unit having the different output powers, and the standardized frame is for replacement of the power core unit having the different dimension specifications.

4. The cabinet system according to claim 1, wherein the power core unit is provided with a first electrical connection port; the power supply module comprises:
a docking assembly, comprising a third electrical connection port and a wire connection group coupled to the third electrical connection port and to a plurality of power receiving terminals in the corresponding data server host, the third electrical connection port docked with the first electrical connection port.

5. The cabinet system according to claim 1, wherein a parameter of the power core unit comprises a dimension specification of the power core unit, and both of the dimension specification of the power core unit and the first specification of the standardized frame are compliant with regulations of existing dimension specifications of power supplies.

6. The cabinet system according to claim 1, wherein the standardized frame comprises an opening, a safety regulation information region for labeling a safety specification is provided on an outer surface of the power core unit, and the opening corresponds to the safety regulation information region when the power core unit is assembled in the standardized frame to show the safety specification.

7. A cabinet system of a data center, comprising:
a cabinet body, comprising a front side and a rear side that are opposite, and a plurality of rack modules between the front side and the rear side;
a plurality of data server hosts, detachably installed on the corresponding rack modules; and
a power supply module, disposed on the corresponding rack module in the cabinet body and coupled to at least one of data server hosts, the power supply module comprising:
a standardized frame, compliant with a first specification, comprising an accommodating groove, the accommodating groove used for plug-in assembly of a plurality of power core units having different parameters;
wherein the standardized frame enables the plurality of power core units to be detachably replaced at the rear side of the cabinet body, and simultaneously accommodates at least two of the power core units; and
wherein each of the plurality of power core units is provided with a first electrical connection port, the power supply module comprises:
a first power supply board disposed in the standardized frame, and a plurality of second electrical connection ports provided on the first power supply board for docking with the plurality of first electrical connection ports, the plurality of second electrical connection ports coupled to a digital control module, the digital control module modulating electrical power from the plurality of power core units to drive the plurality of information server hosts.

8. The cabinet system according to claim 7, wherein a parameter of each of the plurality of power core units comprises a dimension specification of each of the plurality of power core units, a quantity of the plurality of power core units is two, and a configuration relationship of the two power core units is one selected from a group consisting of: a combination of both IPC-Flex, a combination of both IPC-1U, and a combination of IPC-Flex and IPC-1U.

9. The cabinet system according to claim 8, wherein each of the plurality of first electrical connection ports is a golden finger connector, each of the plurality of second electrical connection ports is a docking connector, each of the plurality golden finger connectors and each of the plurality of docking connectors individually comprise a plurality of terminals, an application combination of the plurality of terminals corresponds to the power core unit having different predetermined specifications, and the standardized frame is for replacement of the power core units having the different predetermined specifications.

10. The cabinet system according to claim 7, wherein each of the plurality of power core units is provided with a first electrical connection port; the power supply module comprises:
a conductive element, disposed in the standardized frame, for uniting electrical power provided by the plurality of power core units as synergy;
a first power supply board, disposed in the standardized frame, comprising thereon a plurality of second electrical connection ports docked with the plurality of first electrical connection ports, the first power supply board coupled to the conductive element, each of the plurality of second electrical connection ports coupled to the conductive element; and
a second power supply board, disposed in the standardized frame and coupled to the first power supply board via the conductive element, the second power supply board carrying a second digital control module coupled to the conductive element, the second digital control module modulating electrical power from the conductive element to drive the corresponding data server host.

11. The cabinet system according to claim 7, wherein each of the plurality of power core units is provided with a first electrical connection port; the power supply module comprises:
a plurality of docking assemblies, each comprising a third electrical connection port, and a plurality of wire connection groups coupled to the third electrical connection port and coupled to a plurality of power receiving terminals in the corresponding data server host.

12. The cabinet system according to claim 7, wherein a parameter of each of the plurality of power core units comprises a dimension specification of each of the plurality of power core units, and all of the dimension specification of each of the plurality of power core units and the first specification of the standardized frame are compliant with regulations of existing dimension specifications of power supplies.

13. The cabinet system according to claim 7, wherein the standardized frame comprises a plurality of openings, a safety regulation information region for labeling a safety specification is provided on an outer surface of each of the plurality of power core units, and when the plurality of power core units are assembled in the standardized frame, the plurality of openings correspond to the safety regulation information regions on the outer surfaces of the plurality of power core units to show the safety specification.

14. The cabinet system according to claim 7, wherein the standardized frame comprises an opening, a safety regulation information region for labeling a safety specification is provided on an outer surface of each of the plurality of power core units, and when the plurality of power core units are assembled in the standardized frame, the safety specification on the outer surfaces of the plurality of power core units assembled in the accommodating groove of the standardized frame is shown through the opening.

* * * * *